United States Patent [19]
Moyer et al.

[11] Patent Number: 5,355,008
[45] Date of Patent: Oct. 11, 1994

[54] DIAMOND SHAPED GATE MESH FOR CELLULAR MOS TRANSISTOR ARRAY

[75] Inventors: James C. Moyer, San Jose; Martin J. Alter, Los Altos; Helmuth R. Litfin, Cupertino, all of Calif.

[73] Assignee: Micrel, Inc., San Jose, Calif.

[21] Appl. No.: 155,029

[22] Filed: Nov. 19, 1993

[51] Int. Cl.$^5$ .............. H01L 29/10; H01L 29/78; H01L 23/48
[52] U.S. Cl. .................. 257/341; 257/401; 257/758; 257/776; 257/342
[58] Field of Search ............... 257/341, 342, 758, 401, 257/774, 776

[56] References Cited

U.S. PATENT DOCUMENTS 4,833,521  5/1989  Early .................... 257/774

FOREIGN PATENT DOCUMENTS

| | | | |
|---|---|---|---|
| 62-242364 | 10/1987 | Japan | 257/401 |
| 2-161755 | 6/1990 | Japan | 257/758 |
| 438878 | 2/1992 | Japan | 257/342 |
| 4-111360 | 4/1992 | Japan | 257/335 |

Primary Examiner—Jerome Jackson
Assistant Examiner—Donald L. Monin, Jr.
Attorney, Agent, or Firm—Skjerven, Morrill, MacPherson, Franklin & Friel

[57] ABSTRACT

A cellular transistor structure is disclosed which incorporates a polysilicon gate mesh. In one embodiment, the silicon under the polysilicon is of an N-type while the exposed area not covered by the polysilicon is doped with a P dopant to form P-type source and drain regions. Metal strips are used to contact the rows of source and drain cells. By forming the openings in the polysilicon mesh to be in a diamond shape (i.e., having a long diagonal and a short diagonal), the source and drain metal strips, arranged in the direction of the short diagonals, can be made wider and shorter, thus reducing the on-resistance of the transistor without increasing the area of the transistor.

19 Claims, 7 Drawing Sheets

DIAMOND SHAPED GATE MESH FOR CELLULAR MOS TRANSISTOR ARRAY

FIELD OF THE INVENTION

This invention relates to metal-oxide-semiconductor (MOS) transistors and, in particular, to an improved MOS transistor having a lower on-resistance.

BACKGROUND OF THE INVENTION

Low on-resistance MOS transistors are desirable for their low power loss and ability to conduct high currents. It is well known that a cellular array of vertical double-diffused MOS (VDMOS) transistors can be made to have a very low on-resistance ($R_{ON}$) X Area product ($\Omega$ mils$^2$). This is partly because no top surface area is used to form drain regions, thus allowing a higher density of transistors to be connected in parallel and a source metal layer to substantially cover the top surface of the transistor structure. The large source metal width provides a low metal resistance, while the high density of the transistors connected in parallel provide a very low transistor on-resistance between the source regions and the drain. FIG. 8 illustrates a conventional N-channel VDMOS transistor to be described in detail later.

For integrated circuit (IC) applications, forming N-channel and P-channel VDMOS transistors in the same substrate is impractical. Additionally, it may be desirable to connect the body of a transistor to a separate biasing voltage, which cannot be done with cellular VDMOS transistors. Other limitations also exist with VDMOS transistors when formed in an IC, such as a high drain-to-substrate capacitance and a large overhead associated with bringing the drain up to the top surface of the substrate for interconnecting the VDMOS transistors with other circuitry on the same substrate. A VDMOS transistor when formed as a discrete device may require a large overhead associated with terminating the outer edges, as well as contain a large parasitic JFET and have a high epitaxial drain resistance.

Forming P-channel discrete VDMOS transistors creates additional problems due to the difficulty in fabricating a low resistivity P+ substrate, the need for a thicker P epitaxial layer to allow for P autodoping by the substrate, and the difficulty in controlling the resistivity of the P epitaxial layer.

In situations where the drawbacks of a VDMOS transistor prevent its use, lateral MOS transistors have traditionally been used, although their $R_{ON}$ X Area product is not as low as that of the VDMOS transistors.

FIG. 1 is a top-down view of a conventional lateral P-channel MOS transistor which serves to illustrate some causes of increased on-resistance. In FIG. 1, an N-type substrate 10 has formed over it a relatively wide polysilicon gate 12 which is insulated from the top surface of substrate 10 by a layer of gate oxide. The gate 12 acts as a mask while doping the area 14 with P-type dopants to form self-aligned source and drain regions 16–19. A layer of oxide (e.g., one micron thick) is deposited over the polysilicon gate 12 (after the polysilicon is oxidized) to insulate gate 12 from a metal layer which is subsequently deposited over the surface of the wafer to contact the source and drain regions 16–19.

The metal layer is selectively etched away to form metal strips overlying the source regions 16 and 18 and the drain regions 17 and 19. The metal strips contact the source and drain regions at spaced contact points 20 along the length of the source and drain regions. The metal strips contacting the source regions 16/18 are connected to a source voltage $V_S$. Similarly, the metal strips contacting the drain regions 17/19 are connected to a drain voltage $V_D$. A gate voltage $V_G$ is connected to one or both ends of the polysilicon gate 12.

As seen by the schematic representations of resistance along the metal strips, the voltages along the lengths of the metal strips vary. The metal-to-source or metal-to-drain contacts 20 along the lengths of the source and drain regions force the source and drain regions to have a size larger than the contacts 20. Increasing the spacing of the contacts 20 or reducing the size of the contacts 20, especially along the source regions, adversely affects the transistor gain between the contacts 20 due to the resistance of the source and drain regions. As seen, numerous tradeoffs must be made between on-resistance, transistor gain, and transistor size when using a strip type lateral MOS transistor design.

One conventional method used to decrease the on-resistance of the transistor shown in FIG. 1 is to increase the width of the metal strips and increase the metal-to-source and metal-to-drain contact area; however, this also increases the size of the transistor and thus does little to reduce the $R_{ON}$ X Area product of the transistor. Forming the metal strips thicker to reduce on-resistance requires complicated dry-etching techniques to etch the metal and, thus, increases the cost of the product.

What is needed is a novel lateral transistor which has very low on-resistance but does not lower on-resistance by sacrificing area, and which could be used in CMOS applications.

SUMMARY

A cellular transistor structure is disclosed which incorporates a polysilicon gate mesh. In one embodiment, the silicon under the polysilicon is of an N-type while the exposed area not covered by the polysilicon is doped with a P dopant to form self-aligned, P-type source and drain regions. Metal strips are used to contact the rows of source and drain regions.

By forming the openings in the polysilicon mesh to be in a diamond shape (i.e., having a long diagonal and a short diagonal), the source and drain metal strips arranged in the direction of the short diagonals can be made wider, thus reducing the on-resistance of the transistor without increasing the area and without requiring thicker metal.

Further, this cellular approach increases the effective gate width (and source/drain area) since each diamond-shaped source and drain region is formed such that only one metal contact is needed in the center of each diamond-shaped source and drain region to properly bias the regions.

In an additional embodiment, instead of actual diamond shaped openings, the openings in the polysilicon mesh form a propeller shape (approximating a diamond shape) having all internal angles being a multiple of 45°. This makes it easier to fabricate the polysilicon gate while still obtaining the benefits of the wider source and drain metal strips.

DETAILED DESCRIPTION OF THE PREFERRED EMBODIMENTS

Figure 2:
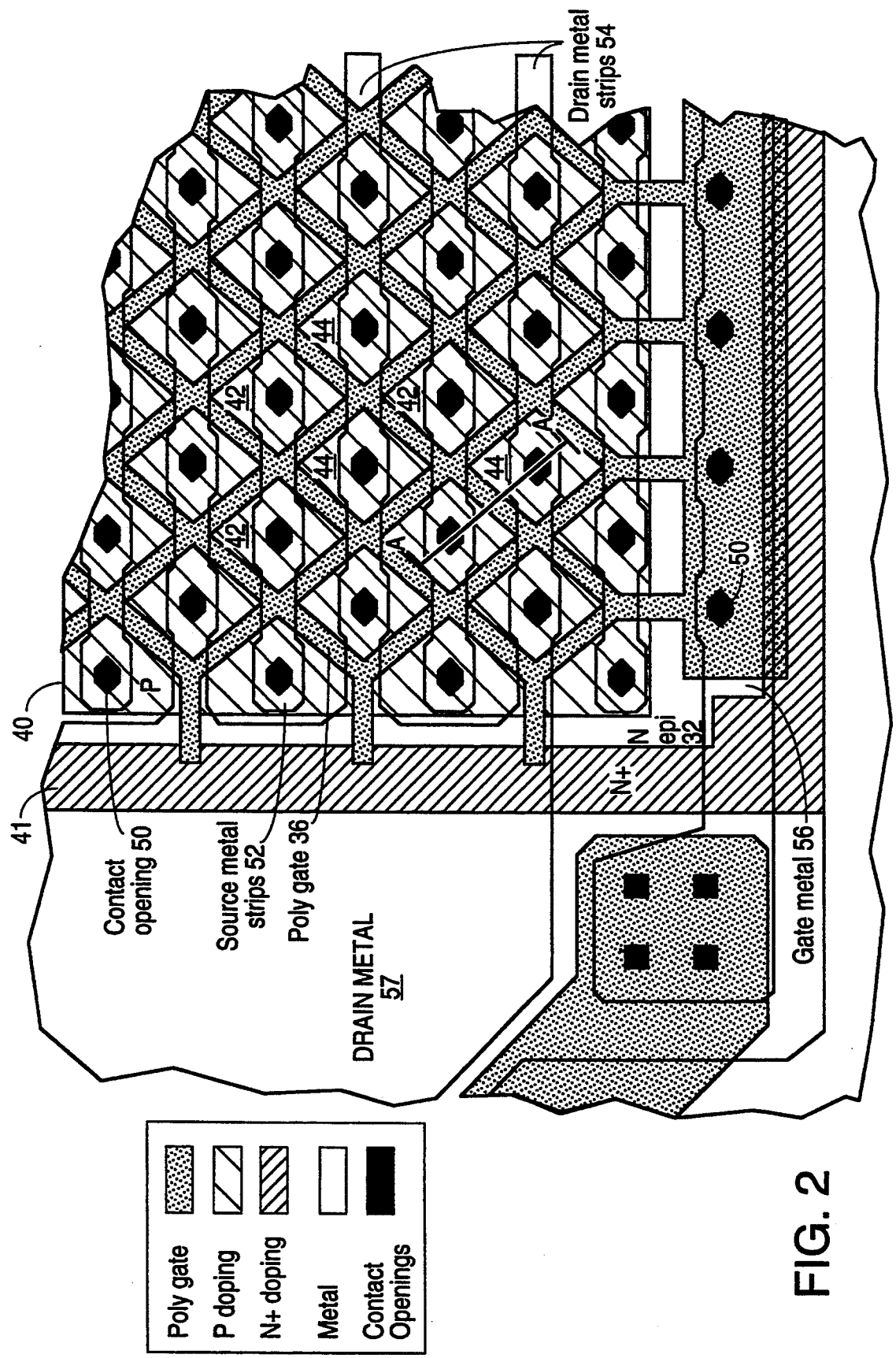
FIG. 2 is a top view of a cellular transistor having a mesh gate and diamond shaped source and drain regions in accordance with one embodiment of the invention.

FIG. 2 illustrates the various regions and layers of a novel transistor. The mesh gate pattern in FIG. 2 results in a dense array of cellular, lateral MOS transistors while enabling the source metal strips and drain metal strips to be wider to thus reduce their resistance and lower the on-resistance of the transistor without sacrificing area. Additionally, the cellular configuration minimizes the source and drain area lost where the metal strips make contact to the source and drain regions.

In an actual top view of the transistor, the metal portions would obscure any underlying portions. In FIG. 2, the metal portions are made transparent to better illustrate the preferred transistor structure. The masks used to form the novel transistor may be derived from the representation of FIG. 2.

A complete transistor array is not shown for simplicity. The remainder of the transistor would be substantially identical to the portion shown in FIG. 2 but with a source metal plate (instead of a drain metal plate) connecting together the various source metal strips (to be described later). The size of the transistor array can be selected to achieve virtually any on-resistance and current handling capacity.

The transistor of FIG. 2 will be described in conjunction with FIG. 3, which is a cross-sectional view of a portion of the transistor taken along line A—A in FIG. 2.

The starting substrate in one embodiment is a P-type silicon substrate 30 (FIG. 3) having a resistivity of approximately 6 ohms-cm. (A similar P-channel discrete device could be built in an N-type substrate having a resistivity of approximately 0.8 ohms-cm.) An N-epitaxial layer approximately 10 microns thick is then grown on the surface of the substrate 30 using conventional techniques. In one embodiment, the resistivity of epitaxial layer 32 is approximately 0.8 ohms-cm. The surface of this epitaxial layer 32 is shown in FIG. 2 by the portions 32.

Instead of forming the transistor in an N- epitaxial layer, the P-channel transistors may instead be formed in N-wells formed in the P-type substrate 30. N-channel transistors can then be formed directly in the P substrate 30 to form CMOS devices.

In an alternative embodiment, the substrate 30 may be an N-type. In this alternative embodiment, an epitaxial layer may be eliminated and the transistors may be built directly in the substrate or formed in doped P-wells.

If desired, an N+ buried layer may be formed at the interface of the N- epitaxial layer 32 and substrate 30, using well known techniques, to reduce the beta of any parasitic PNP bipolar transistor formed.

A thin (e.g., 500 Angstroms) layer of gate oxide 34 (FIG. 3) is then grown on the surface of the N— epitaxial layer 32.

A layer of polysilicon is then deposited on the surface of the gate oxide 34 to a thickness of approximately 5,000 Angstroms and then defined using conventional photolithographic and dry etching techniques to produce the polysilicon gate 36. The polysilicon may be predoped or doped in a later doping step to be made conductive. In the preferred embodiment, the polysilicon is doped heavily N-type. As shown in FIG. 2, the gate 36 is formed to resemble a mesh having diamond shaped openings. In one embodiment of the invention, each of the diamond shaped openings has inner angles 78° and 102°, where the opposing 78° angles intersect the long diagonal of the diamond and the opposing 102° angles intersect the short diagonal. In other embodiments, the acute internal angles may range from approximately 45° to 85° and the obtuse angles may range from approximately 135° to 95°.

Next, a P doping mask is used in a conventional photolithographic and etching process to expose the polysilicon gate 36 and the surface of the epitaxial layer 32 within the diamond shaped openings. P dopants, such as boron ions, are then implanted into the exposed surface of the wafer at a dosage of approximately $3 \times 10^{15}$ ions/cm$^2$ and at an energy of approximately 35 keV. The optimum dosage and energy will depend upon details of the particular process parameters used and the desired operating characteristics of the device. The area in FIG. 2 which is exposed during this P doping step is illustrated by the area inside line 40. During this doping process, the gate 36 acts as a mask to self-align source 42 and drain 44 regions within epitaxial layer 32. This implantation step may also be used to cause the polysilicon gate 36 to be highly conductive if the polysilicon has not been previously doped. The implanted boron ions may be activated and diffused in a subsequent heating step. This heating step may be the same step used to oxidize the wafer at a later time. An N+ ring 41 may also be used to form a guard ring (channel stop) around the periphery of the transistor array, as shown.

Well known gate edge spacers may be formed, if desired, prior to the P doping process to prevent the P doping from subsequently diffusing too far under the gate 36.

In an optional step to reduce the resistivity at the surface of the various source 42 and drain 44 regions, a layer of oxide (or other suitable material) is deposited or grown over the surface of the wafer and then etched back to expose the surface of the source 42 and drain 44 regions while leaving a narrow oxide portion remaining around the gate edges. A salicide (self-aligned silicide) is then formed on the exposed surfaces of these regions by sputtering or evaporating a thin layer of a refractory metal (such as Mo, Ta, Ti, W) or a near-noble metal (Co, Ni, Pd, Pt) over the exposed silicon regions and then heating the wafer to react the metal with the silicon to form a salicide. The residual metal overlying any oxide is then rinsed away using conventional etching techniques. The resistivity of the salicide will be approximately 5 ohms/square, while that of the underlying P+ regions may be approximately 100 ohms/square. Such a salicide forming process is well known and will not be discussed in detail. If desired, gate polycide may also be formed concurrently with the formation of the salicide.

Next, an insulating layer (approximately one micron thick) of oxide 46 is deposited over the surface of the wafer. This layer of oxide 46 is then patterned and etched to form the various contact openings 50 in the oxide 46. These contact openings 50 are shown in FIG. 2 as black spots. Two such contact openings 50 are shown in FIG. 3 extending down to the source 42 and drain 44 regions.

Next, a metal layer, such as a conventional aluminum or aluminum alloy layer, is deposited on the surface of the wafer using well known techniques. The metal layer is then patterned and etched using conventional photolithographic and etching techniques to form source metal strips 52 and drain metal strips 54 which overlie and contact the various source 42 and drain regions 44, respectively.

The metal layer defining step also forms a gate metal strip 56, which makes contact to the polysilicon gate 36 via the contact openings 50 shown at the bottom of FIG. 2. A similar gate metal strip (not shown) makes contact to gate 36 at the other end of the gate 36.

The drain metal strips 54 terminate in a large drain metal plate 57 which is connected to a drain voltage source. Similarly, on the opposite side of the transistor (not shown), a source metal plate connects all the source metal strips 52 together and is connected to a source voltage. The source metal plate and connections to the source metal strips 52 may be essentially a mirror image of the drain metal plate 57 and drain metal strips 54.

The gate metal strip 56 is connected via either a metal extension or polysilicon extension to a gate voltage source (not shown).

Figure 3:
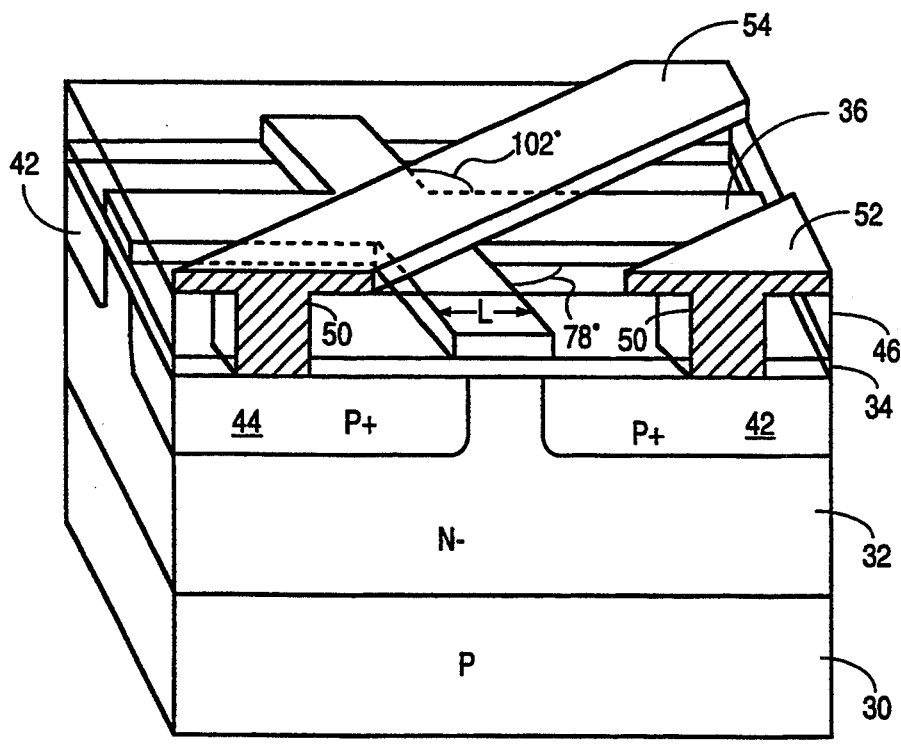
FIG. 3 is a perspective view in cross-section of a portion of the transistor structure of FIG. 2 taken along line A—A, where the transistor is part of an IC.

In the embodiment shown in FIGS. 2 and 3, the length L of gate 36 is approximately 3 microns, and the long diagonal and short diagonal of the various source 42 and drain 44 regions are approximately 16.5 microns and 13.5 microns, respectively. These lengths may be modified depending upon the required operating conditions (e.g., voltage levels) of the device. The widths of the source and drain metal strips 52 and 54 are approximately 5 microns.

It can be appreciated that as the diamond shaped openings formed by gate 36 become more elongated by increasing the long diagonal of the openings and decreasing the short diagonal, the separation between the centers of adjacent source 42 and drain 44 regions is increased while the separation between the centers of adjacent source 42 regions in a single source row or between the centers of adjacent drain 44 regions in a single drain row is decreased. The overall gate width and the area of the transistor, however, remain substantially unchanged. By increasing the separation between adjacent source 42 and drain 44 regions, the width of the source metal strips 52 and drain metal strips 54 may be increased. This widening of the strips reduces the resistance of the strips but does not increase the area required for the transistor. Thus, the on-resistance of the transistor is decreased without sacrificing any area.

Additionally, as the separation between adjacent source 42 regions in a source row and adjacent drain 44 regions in a drain row is decreased, the required length of the source metal strips 52 and drain metal strips 54 decreases, further reducing the on-resistance caused by the inherent resistivity of the metal strips.

Also, since the gate 36 surrounds each of the contact openings 50, only one central contact per diamond-shaped region is needed to properly bias each source and drain region. The surface area of the source and drain regions is efficiently utilized since the regions are substantially uniformly biased along the gate due to the central metal contact.

Figure 1:
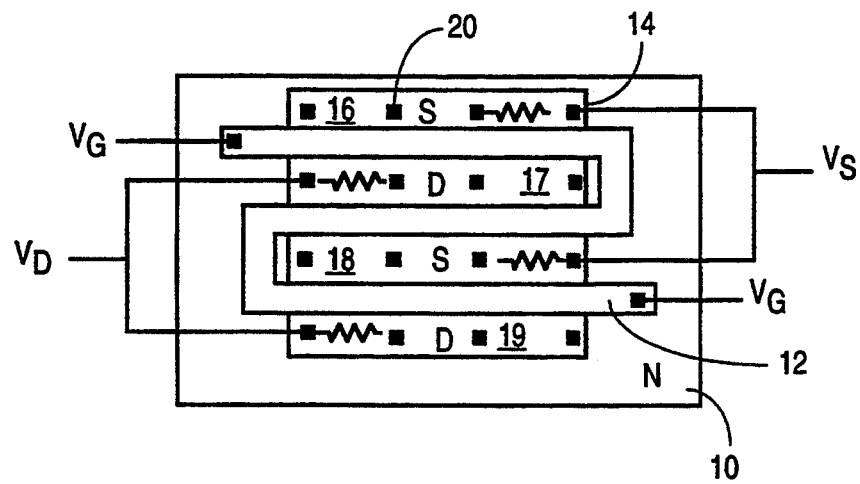
FIG. 1 is a top view of a conventional stripe-type lateral MOS transistor.

For the reasons given above, the architecture of FIG. 2 enables one to produce a transistor having a lower $R_{ON}$ X Area product than previous cellular transistor designs or previous stripe-type transistor designs such as shown in FIG. 1. A comparison between the diamond shaped cellular structure of FIG. 2 and a traditional stripe design, similar to that shown in FIG. 1, showed that the diamond shaped cellular structure had roughly 50% better efficiency ($R_{ON}$ X Area product) than the stripe design.

Generally, it is much easier to pattern the polysilicon gate to have angles of 45° and multiples thereof. Therefore, the gate structure of FIG. 4 may be more desirable than that of FIG. 2, since the diamond shaped openings in FIG. 2 have been replaced by propeller shaped patterns whose internal angles are multiples of 45°.

Figure 4:
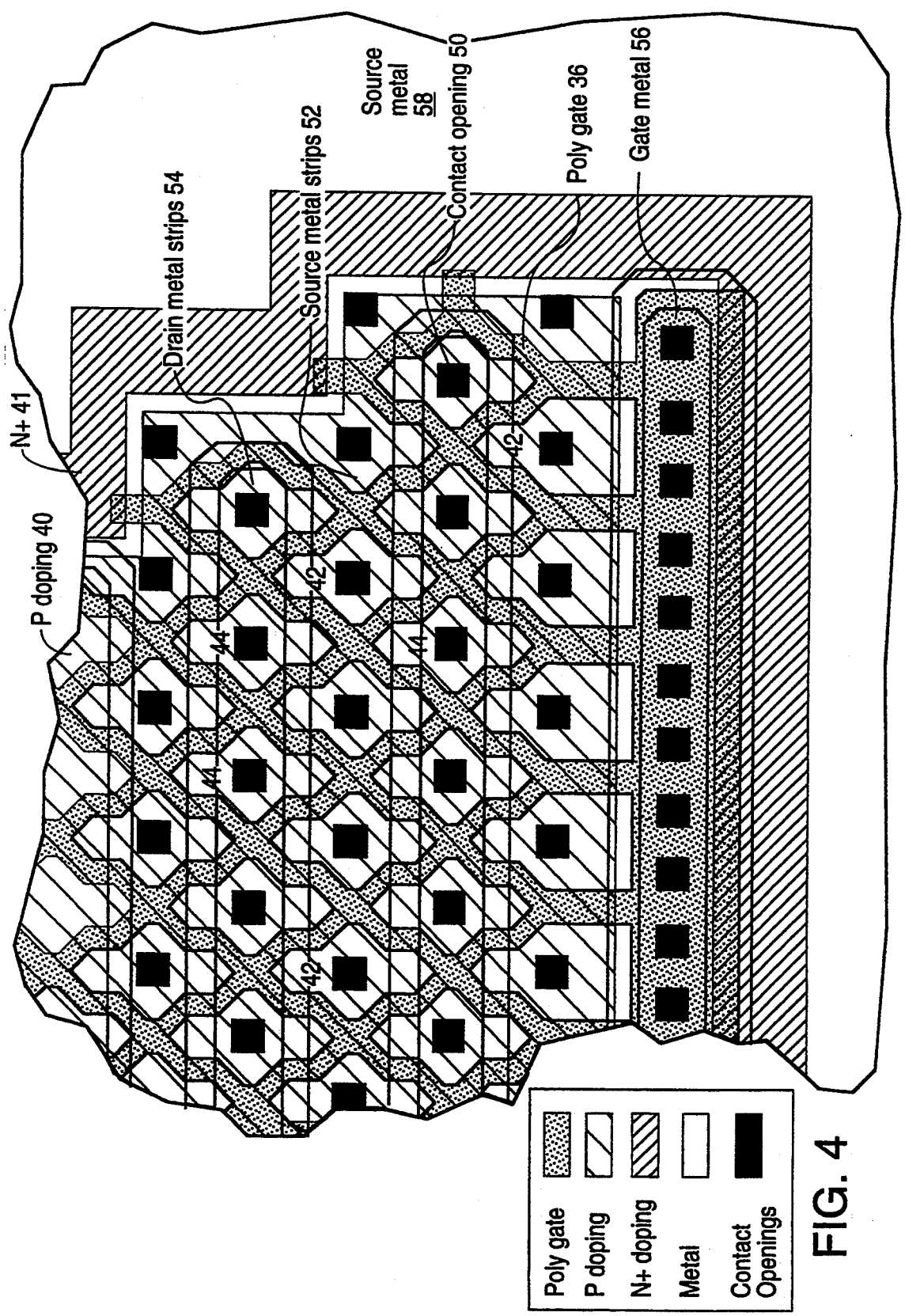
FIG. 4 is a top view of a cellular transistor similar to that of FIGS. 2 and 3 but having propeller shaped source and drain regions in accordance with another embodiment of the invention.

The various patterned layers and regions represented by FIG. 4 are labelled with the same numbers as in FIG. 2 since this structure is essentially identical to the structure of FIG. 2 except for the pattern of polysilicon gate 36. The portion of the transistor illustrated in FIG. 4 shows the source metal plate 58 on the right side of the structure shorting together the source metal strips 52. The structure of FIG. 2 would have a similar source metal plate 58 shorting together the source metal strips 52 in FIG. 2. A drain metal plate (not shown) is formed on the left end of the transistor structure of FIG. 4 identical to that shown in FIG. 2.

The method for forming the structure illustrated by FIG. 4 is identical to that described with respect to FIGS. 2 and 3, and the resulting structure will be similar to that shown in FIG. 3 but with openings formed by gate 6 having a propeller shape rather than a diamond shape pattern.

In the embodiment of the transistor of FIG. 4, the length of the gate 36 is approximately 2.75 microns, the long diagonal openings are approximately 18.25 microns, and the short diagonal openings are approximately 10.25 microns. The contact openings 50 are approximately 3 microns across. The widths of the source metal strips 52 and drain metal strips 54 are approximately 7.5 microns.

In the embodiments of FIGS. 2–4, although increasing the long diagonal of the diamond shaped openings (or roughly diamond shaped openings in FIG. 4) allows the metal strips 52 and 54 to be made desirably wider, the resistance between the central metal contact and the far edges of a P+ source 42 or drain 44 region undesirably increases. This increases the voltage drop along the region and lowers the overall gain of the transistor. Forming a silicide on the surface of the source 42 and drain 44 regions greatly decreases this resistance. Still, for a particular source/drain doping level and device size (among other considerations), there will be an optimum diamond opening shape which will provide the lowest $R_{ON} \times$ Area product.

Figure 5:
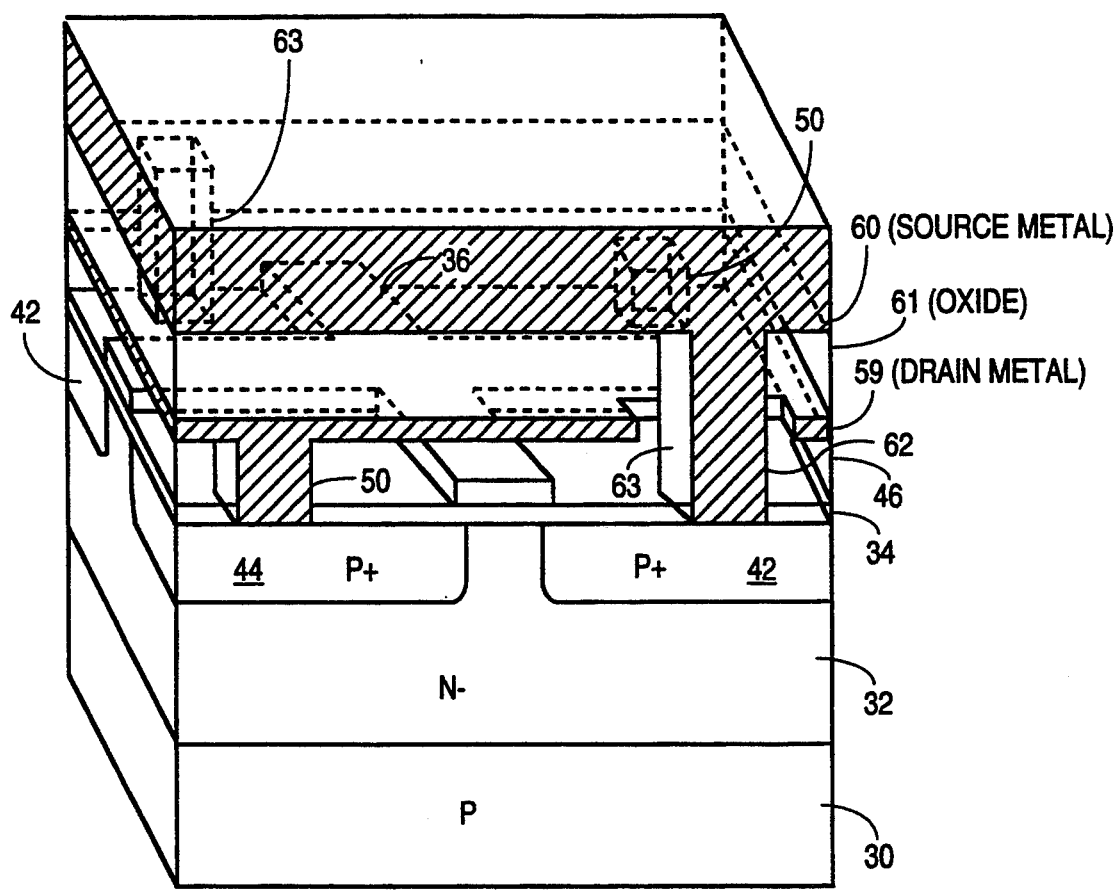
FIG. 5 is a perspective view in cross-section of a cellular transistor using overlying source and drain metal layers in accordance with a double-metal embodiment of the invention, where the transistor is part of an IC.

FIG. 5 illustrates an alternative embodiment of the invention which achieves an even lower source metal and drain metal resistance. The transistor structure of FIG. 5 includes a drain metal first layer 59 and an overlying source metal second layer 60. An oxide layer 61 (or other suitable dielectric) insulates the metal layers 59 and 60. The remaining elements are similar to the identically numbered elements in FIG. 3.

To form the structure of FIG. 5, the drain metal layer 59 is formed to overlie the entire transistor array surface, making contact to the drain regions 44 and source regions 42 using contact openings 50 and 62. The drain metal layer 59 is etched away from around the verical metal posts 63 which contact the source regions 42 through openings 62 to electrically isolate those metal posts 63 from the drain metal layer 59.

The oxide layer 61 is then deposited over the drain metal layer 59.

Openings are then etched through the oxide layer 61 to expose the tops of the metal posts 63. Refractory metal plugs can then be formed, if desired, to partially fill the openings exposing metal posts 63 prior to the deposition of the source metal layer 60. The refractory metal plugs will better enable the source metal layer 60 to reliably contact the metal posts 63.

A thick source metal layer 60 is then deposited to overlie the drain metal layer 59 and oxide 61 and make contact with the source regions 42 through the refractory metal plugs and metal posts 63.

The design of FIG. 5 achieves an even lower $R_{ON} \times$ Area product than the design shown in FIGS. 2 and 4 due to the low resistance of the large metal layers 59 and 60. This concept is particularly attractive for submicron gate technologies since very narrow metal lines do not have to be etched and since double metal is often already required for other components on the same wafer.

Figure 6:
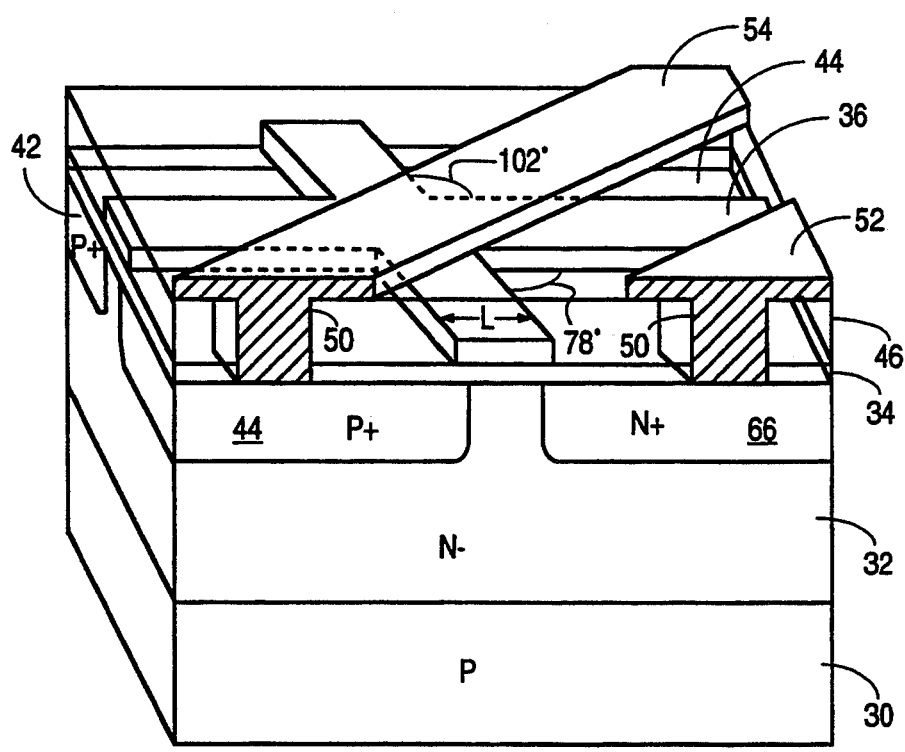
FIG. 6 is a perspective view in cross-section of a portion of the transistor of FIG. 3 showing a region used as a body contact region to bias the body of the transistor, where the transistor is part of an IC.
Figure 8:
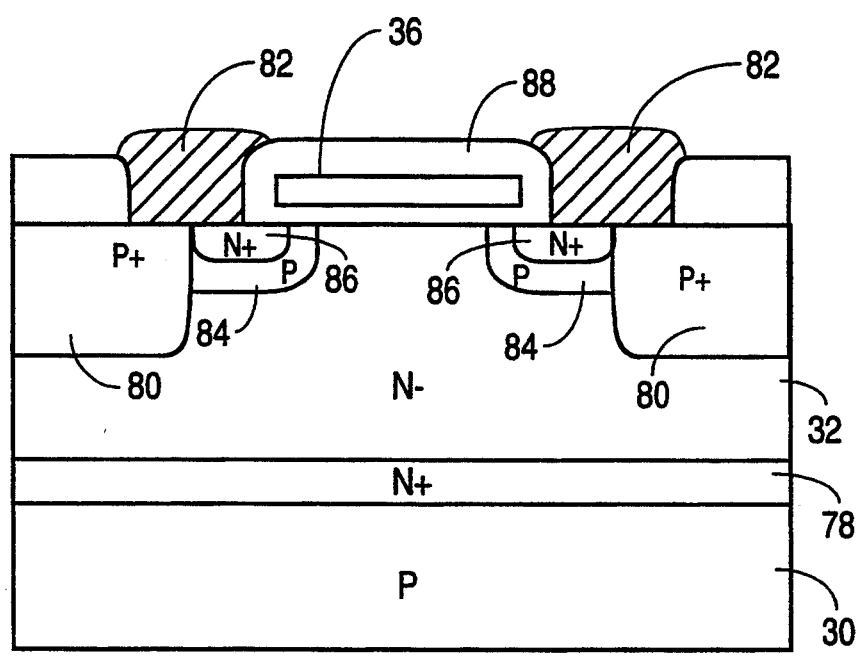
FIG. 8 is a cross-sectional view of a conventional N-channel VDMOS transistor which may be formed in the same substrate as the lateral transistors of FIGS. 2–7.

FIG. 6 illustrates one way the body of the transistor of FIG. 3 may be contacted. Along with the various P+ source 42 and drain 44 regions shown in FIG. 3, selected regions 66 (e.g., peripheral regions) are formed to have the same conductivity type as the body of the transistor, in this case an N conductivity type. These N+ regions 66 are then connected to a reference voltage to bias the body (epitaxial layer 32) of the transistor. If the body bias voltage is to be the source voltage, the source metal strips 52 may contact the regions 66. If a third voltage is to be used to bias the body, a separate metal strip or metal layer would be used to contact regions 66. Biasing the body enables the transistor to operate in a four-terminal mode. This mode is often useful to designers and is not available with VDMOS transistors, such as shown in FIG. 8.

Figure 7:
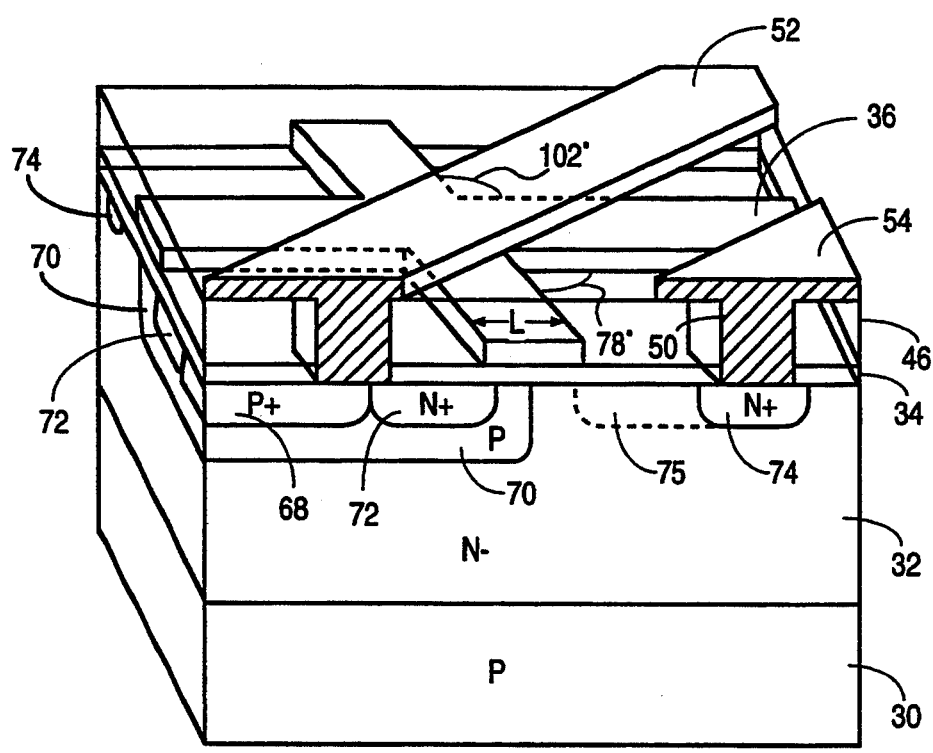
FIG. 7 is a perspective view in cross-section of another embodiment of the invention where a cellular, lateral DMOS transistor is formed having a lightly doped drain region, where the transistor is part of an IC.

FIG. 7 illustrates another embodiment of the invention where a cellular, lateral DMOS transistor is formed. The advantages of the gate mesh are still realized. To form the structure of FIG. 7, a P+ body contact 68 is formed in the center of the source region openings followed by a P diffusion to form the body 70 extending under the gate 36. An N doping process is then used to form the N+ source region 72 and N+ drain region 74. In an optional configuration, the N+ region 74 is not separated from the gate 36, as illustrated by dashed lines 75. In another configuration, the gate oxide under the drain side of gate 36 may be made thicker to achieve a higher breakdown voltage. The resulting lateral DMOS transistor of FIG. 7 includes a lightly doped drain (i.e., N− epitaxial layer 32) to accommodate relatively high operating voltages. N-channel transistors can be built in a similar manner in a P-well in epitaxial layer 32, where region 75 is a lightly doped drain extension (for achieving a high breakdown voltage) and the N+ region 74 contacts the drain electrode.

The N-channel DMOS transistor shown in FIG. 7 can be made a P-channel device by changing the conductivity types of the substrate, epitaxial layer, and various regions. Additionally, a P-channel DMOS device may be formed in a P-well, where the P-well is formed within the N− epitaxial layer 32 or within an N− substrate.

In the devices shown in FIGS. 2–4, 6, and 7, the two-layer metal technique shown in FIG. 5 may be used to further decrease the on-resistance of the device.

The resulting transistors described with respect to FIGS. 2–7 have low $R_{on} \times$ Area products which are similar to those of VDMOS transistors; this is especially true for P-channel VDMOS transistors. An important advantage of these lateral transistors described with respect to FIGS. 2–7 is that they may be easily formed in the same N− epitaxial layer 32 (or N− substrate) as N-channel VDMOS transistors, such as the VDMOS transistor shown in FIG. 8. These lateral devices may also be formed in an integrated circuit where top surface drain contacts are needed.

The N-channel VDMOS transistor of FIG. 8 uses the same substrate 30 and epitaxial layer 32 as the P-channel devices described with respect to FIGS. 2–7. The process used to form the N-channel VDMOS transistor of FIG. 8 is compatible with that used to form the transistors of FIGS. 2–7 so that CMOS devices having similar $R_{ON} \times$ Area products may be formed on the same wafer.

The VDMOS transistor uses an N+ buried layer 78, which is formed prior to the formation of the epitaxial layer 32. The N+ buried layer 78 may be contacted at the surface of the wafer by the use of N+ sinkers extending down from the surface of the wafer to the buried layer 78.

The P+ body contact region 80 may be formed using conventional patterning and doping techniques. The P+ body contact region 80 enables ohmic contact to a subsequently formed metal layer 82.

The P body region 84 and N+ source region 86 may be formed self-aligned with gate 36 using well known techniques. An insulating oxide layer 88 is grown over the gate 36 and an additional layer of oxide is then deposited to insulate the gate 36 from the subsequently formed metal layer 82.

Although a lateral P-channel device has been described with respect to the various figures, the device may also be formed as an N-channel device by reversing the conductivity types of the various regions. However, the P-channel device inherently can be operated at higher voltages than an N-channel version due to the well known snap-back phenomena in lateral N-channel devices which limits their maximum operating voltage. Accordingly, the higher operating voltage of the N-channel VDMOS device of FIG. 8 (or other transistor devices using a lightly doped drain) would be compatible with the described lateral P-channel devices for CMOS applications.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An MOS transistor comprising:
   a semiconductor material having a top surface;
   a conductive gate overlying and insulated from said top surface of said semiconductor material, said conductive gate forming a mesh having a plurality of substantially identical openings, each of said openings approximating an elongated diamond shape having a long diagonal and a short diagonal,
   first regions of said semiconductor material underlying said gate being of a first conductivity type to form channel regions of said MOS transistor,
   second regions of said semiconductor material exposed by said openings in said mesh being of a second conductivity type to form source regions and drain regions of said MOS transistor, said source regions and drain regions being located in alternate rows of said openings, where each row is along the direction of said short diagonal of said openings;
   a first conductive strip of material overlying and electrically contacting central portions of a first row of said source regions, said first conductive strip for being connected to a source voltage; and
   a second conductive strip of material overlying and electrically contacting central portions of a second row of drain regions adjacent to said first row of said source regions.

2. The transistor of claim 1 wherein a ratio of said long diagonal to said short diagonal is equal to or greater than approximately 1.2.

3. The transistor of claim 1 wherein a ratio of said long diagonal to said short diagonal is equal to or greater than approximately 1.5.

4. The transistor of claim 1 wherein each of said openings is a parallelogram having two internal angles within the range of approximately 45° to 85° and two internal angles within the range of approximately 135° to 95°.

5. The transistor of claim 1 wherein said first conductivity type is an N type.

6. The transistor of claim 1 wherein said first conductivity type is a P type.

7. The transistor of claim 1 wherein said semiconductor material is an epitaxial layer.

8. The transistor of claim 1 wherein said semiconductor material is a well region of said first conductivity type.

9. The transistor of claim 1 wherein each of said openings is formed to have internal angles being multiples of 45° so as to approximate a diamond shape.

10. The transistor of claim 1 further comprising third regions of said semiconductor material exposed by said openings in said gate, said third regions being of said first conductivity type and connected to a reference voltage for biasing a body of said MOS transistor.

11. The transistor of claim 10 wherein said third regions are connected to said first conductive strip of material to short said source regions to said body.

12. The transistor of claim 10 wherein said third regions are connected to an external reference voltage.

13. The transistor of claim 1 wherein said MOS transistor is a lateral double-diffused MOS transistor (LDMOS), wherein said semiconductor material is of said second conductivity type, and wherein said first regions are body regions of said DMOS transistor.

14. The transistor of claim 13 wherein said first regions include a highly doped body contact area of said first conductivity type for shorting to said source regions.

15. The transistor of claim 13 wherein said drain regions include a lightly doped drain portion and a more heavily doped drain portion.

16. The transistor of claim 1 wherein said transistor is interconnected with other components in an integrated circuit.

17. The transistor of claim 1 wherein said transistor is formed as a discrete component.

18. An MOS transistor comprising:
   a semiconductor material having a top surface;
   a conductive gate overlying and insulated from said top surface of said semiconductor material, said conductive gate forming a mesh having a plurality of substantially identical openings, wherein each of said openings approximates an elongated diamond shape having a long diagonal and a short diagonal,
   first regions of said semiconductor material underlying said gate being of a first conductivity type to form channel regions of said MOS transistor,
   second regions of said semiconductor material exposed by said openings in said mesh being of a second conductivity type to form source regions and drain regions of said MOS transistor, said source regions and drain regions being located in alternate rows of said openings;
   a first conductive layer of material overlying said second regions and electrically contacting central portions of a first row of said second regions; and
   a second conductive layer of material overlying and insulated from said first conductive layer and electrically contacting central portions of a second row of said second regions adjacent to said first row of said second regions, said second conductive layer electrically contacting said second row of said second regions using vias through said first conductive layer.

19. The transistor of claim 18 wherein said first conductive layer is for being connected to a source voltage and said second regions in said first row are source regions, and wherein said second conductive layer is for being connected to a drain voltage and said second regions in said second row are drain regions.

* * * * *